United States Patent [19]

Büttner

[11] Patent Number: 4,710,961
[45] Date of Patent: Dec. 1, 1987

[54] MINIATURE HEARING AID HAVING A BINDABLE MULTI-LAYERED AMPLIFIER ARRANGEMENT

[75] Inventor: Gerhard Büttner, Grossenseebach, Fed. Rep. of Germany

[73] Assignee: Siemens Aktiengesellschaft, Berlin and Munich, Fed. Rep. of Germany

[21] Appl. No.: 736,006

[22] Filed: May 20, 1985

[30] Foreign Application Priority Data

Sep. 27, 1984 [DE] Fed. Rep. of Germany ... 8428488[U]

[51] Int. Cl.$^4$ .............................................. H04R 25/00
[52] U.S. Cl. ..................................... 381/68.7; 381/68; 381/69.2
[58] Field of Search ........... 179/107 H, 107 R, 107 S, 179/179; 381/68, 69, 68.7, 68.1–68.6, 69.2, 23.1; 181/129, 130

[56] References Cited

U.S. PATENT DOCUMENTS

| | | | |
|---|---|---|---|
| 3,015,704 | 1/1962 | Behymer | 381/68.4 |
| 4,037,047 | 7/1977 | Taylor | 174/68.5 |
| 4,354,065 | 10/1982 | Buettner | 179/107 H |
| 4,639,556 | 1/1987 | Härtl et al. | 381/169 |

FOREIGN PATENT DOCUMENTS

| | | | |
|---|---|---|---|
| 0089452 | 9/1983 | European Pat. Off. | 179/107 R |
| 0136643 | 4/1985 | European Pat. Off. | 179/107 R |
| 0140078 | 5/1985 | European Pat. Off. | 381/68.7 |
| 78318088 | 10/1978 | Fed. Rep. of Germany | |
| 2724399 | 11/1978 | Fed. Rep. of Germany | |

OTHER PUBLICATIONS

Thomas F. Longwell et al., *Hearing Instruments*, "Flexible Circuitry Leadless Components and Vapor Phase Soldering", vol. 34, No. 2, 1983, pp. 44–47.
Robert Braun; Starr-Flexible Leiterplatten; Funkschau, Jan. 1, 1982.

*Primary Examiner*—Gene Z. Rubinson
*Assistant Examiner*—Danita R. Byrd
*Attorney, Agent, or Firm*—Lawrence C. Edelman

[57] ABSTRACT

A miniature hearing aid comprises an input transducer (18), amplifier (19) and control elements (8, 10) as well as a current source and output transducer (20), where at least a part of the amplifier (19) is applied on mounting surfaces hinged together and lying on mounting plates (46 to 49) and the articulated connections (60 to 63) have a flexible support provided with electrically conducting tracks (50 to 52, 57). The desideratum is, in view of the small space in miniature hearing aids, to obtain a large area for the application of the structural components or elements. This is achieved according to the invention in that the amplifier (19) is designed as a multi-layered system which comprises at least three layers (40 to 42), of which the two outer ones (42, 43) carry the physical or structural elements (53, 54, 54.2) lie over a so-called neutral intermediate layer (40) provided with conductor paths (57), and are subdivided at several mutually opposite points into structural sections, and that the mechanical strength of the intermediate layer (40) permits deformation of the arrangement. The invention is applicable for hearing aids to be worn in the vicinity of the ear, in particular hearing aids to be worn behind the ear.

7 Claims, 7 Drawing Figures

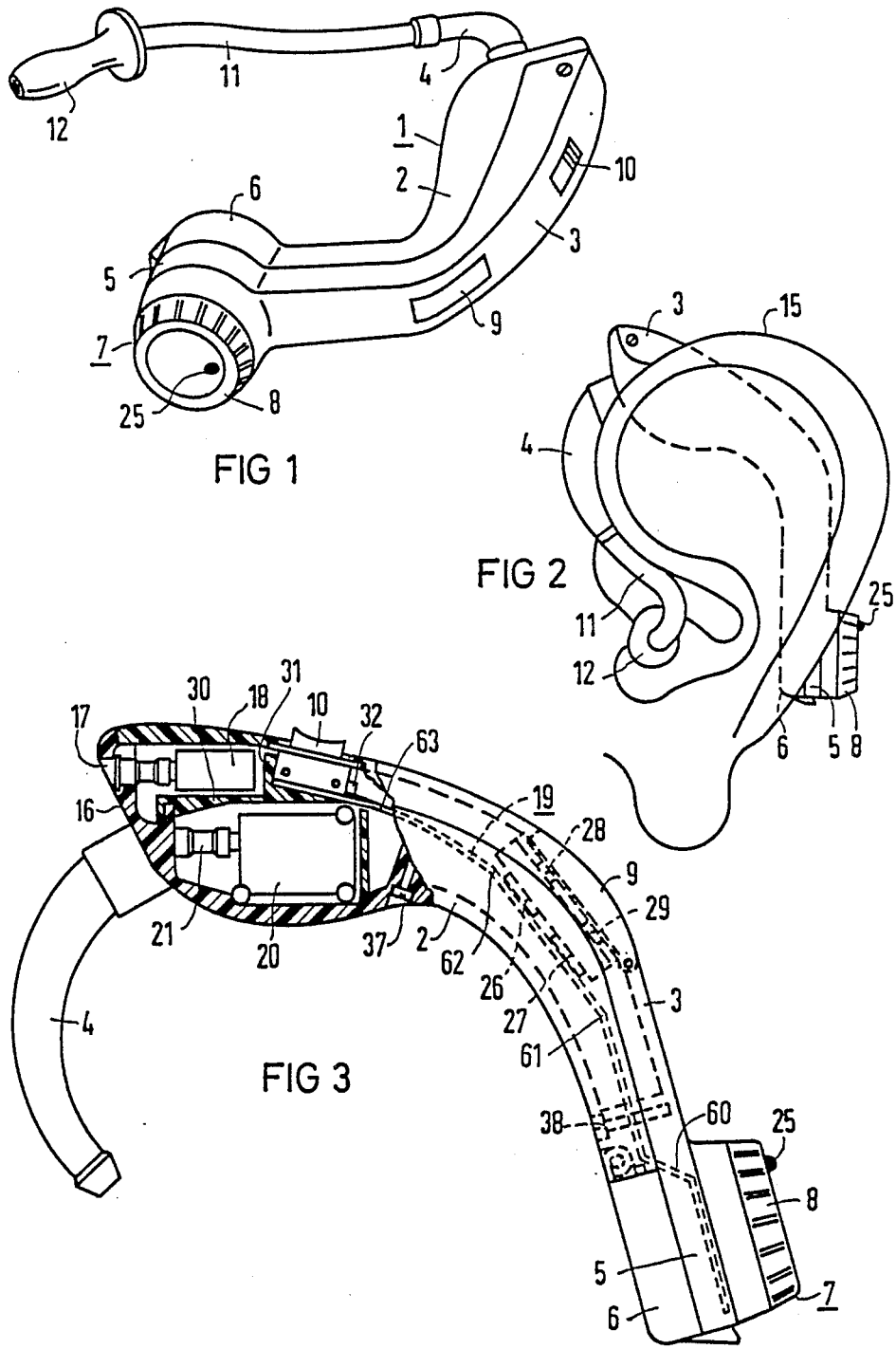

MINIATURE HEARING AID HAVING A BINDABLE MULTI-LAYERED AMPLIFIER ARRANGEMENT

BACKGROUND OF THE INVENTION

This invention relates to miniature hearing aids, and more particularly, it relates to a hearing aid that is worn behind the ear (BEHA).

In behind-the-ear, or BE, hearing aids, which include devices adapted to be used in the bend at the end of an eyeglass frame, there is, as is known, little space to accomodate therein the components of the device required for their operation. A typical one of such devices is known, for example, from U.S. Pat. No. 4,354,065 of the same inventor which issued on Oct. 12, 1982. Since the size of the transducers, controls and current source changes very little in terms of installation space, they require attempts have been made also to optimize the form of the amplifier. According to the previously referred to U.S. patent, for example, the amplifier portion for miniature hearing aids is implemented on several plates and these are joined together by flexible intermediate pieces. Thus an amplifier is obtained which may be folded up and requires little space. But then a specialized arrangement, also requiring space, is necessarily provided for mounting the adjacent movable parts.

SUMMARY OF THE INVENTION

An object of the invention is to obviate the necessity of the typical mounting arrangement used in folder amplifier components required in miniature hearing aids of the previously mentioned kind while still providing relatively large area for the installation of its component parts.

The invention capitalizes from the observation that with a curved and bent structure, available for the installation of the amplifier in particular, in behind-the-ear hearing aids, more can be utilized to a further extent by an arrangement employing several amplifier layers. In addition, the amplifier arrangement may be organized and divided into several structural sections comprising groups of components, between which bending zones are provided joining together the structural groups. In such a layer system, the structural groups may lie over an intermediate layer which also bridges the bending zones between the groups.

With the use of an amplifier constructed in a multilayer arrangement, one needs no folding and no mounting of the folded parts relative to each other, so that a simplification of the assembly is achieved.

In a three-layer system, physical components of two types, discrete and integrated circuit, may be accomodated in the two outer layers, the intermediate layer being a neutral layer having only conductor paths. The advantage of this is that the bending zones of the amplifier are placed in regions which do not include physical parts and therefore provide a less brittle arrangement, so that they break less readily than the other sections of the amplifier which include discrete components. In addition, by using the layered construction one obtains sufficient surface area to accomodate the physical components of the amplifier. Amplifier components such as, for example, integrated circuit chips, are usable components which only have solder points and, while they require more surface area than conventional components provided with soldering lugs, they are readily availale and can be processed at a much lower cost.

As tests have shown, the parts of an amplifier for a BEHA can be arranged into three structural sections or groups of components with each group having two outer structural element layers. The central one of the groups of components lying between the other two sections may conveniently contain an adjusting, or control, arrangement which, in addition to including adjustments for controlling the transmitted frequency and dynamic range, contains an induction coil. This has proved to be very advantageous because with the curved or bent arrangement of the amplifier in its housing an advantageous position has been found for this structural group lying in the central region of the arrangement which permits convenient access to the adjustments. Such a convenient access may be provided by an opening with a flap, or cover, within the wall of the device housing.

An arrangement including three structural sections may contain parts of a connecting intermediate layer extending over the three groups and beyond both ends. With this layer, connecting lines may extend, on the one hand, to contacts to the current source at one end and, on the other, to an on-off switch and to the transducers at the other end.

BRIEF DESCRIPTION OF THE DRAWING

Additional objects and further advantages of the invention will become apparent upon reading the following detailed description while considering the accompanying drawing of illustrative embodiments utilizing the inventive principles.

FIG. 1 is a perspective view of a behind-the-ear (BE) hearing aid equipped with an amplifier designed in accordance with the invention.

FIG. 2 illustrates the device in its normal operating position on the ear.

FIG. 3 is an enlarged side view partially in cross-section.

DETAILED DESCRIPTION

Figure 4:
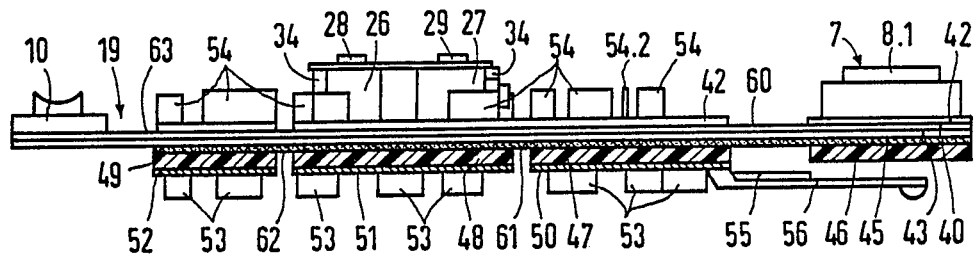
FIG. 4 is a side view of the amplifier adapted for use in the illustrative device.
Figure 5:
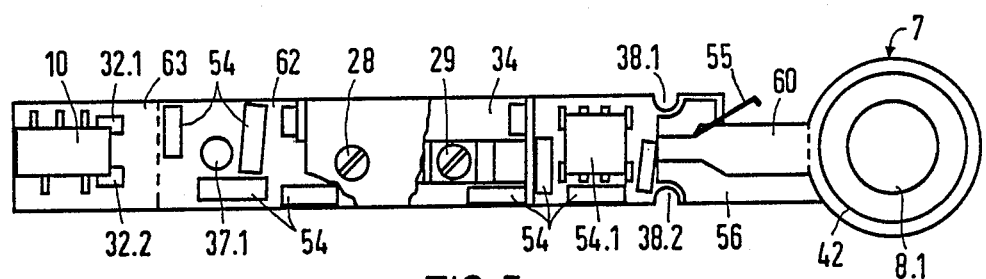
FIG. 5 is a top view of the amplifier showing its upper layer.

In FIG. 1, the housing 1 of a behind-the-ear hearing aid comprises two major parts in the form of shells 2 and 3. At the upper end of housing 1 is a wearing hook 4, while at the opposite lower end is a receptable 5 for a current source. This receptable 5 is enclosed by a cover 6, which may be swung open toward the inside of the curved housing to provide access. Toward the exterior portion of the housing away from the receptable 5, there is located a volume control 7, recognizable by its setting wheel, or knob, 8.

The outer arch of shell 3 has approximately at its center a closure flap 9, and between it and the upper end, a switch 10. At the end of the wearing hook 4, which also serves as a sound conduction canal, a tube 11 is connected. The tube 11 ends in an elastic ear olive 12 serving to connect the device to the auditory canal of its user.

As can be seen from FIG. 2, the device is worn on the ear 15 in such a manner that its inner arch rests against the back of the ear lobe. The device is retained at the proper position on the ear by the hook 4.

As can be seen from a cross-sectional portion of FIG. 3, an opening 17 at the end face 16 allows sound to get to a microphone 18. There the sound is transformed into electrical signals. In an amplifier 19 located in the central part of housing 1, these signals are then amplified in their intensity in accordance with the adjusted frequency response characteristic and supplied finally to a receiver 20. Then the sound produced from the amplified signals by the receiver 20 passes via a line 21, the wearing hook 4, the tube 11 and the ear olive 12 into the user's ear. The amplifier 19 is supplied with energy by a current source retained within the cavity of receptable 5.

The actual control of the acoustic volume reaching the ear is provided by the position of the setter wheel 8. The setting of this wheel is visible by the position of a knob 25 differing in color from its surrounding, and since this knob 25 protrudes beyond the surface of the setter wheel 8, it can also be felt.

At amplifier controls 26 and 27, which are changed or adjusted in their effect through rotary elements 28 and 29, the amplifier 19 responds accordingly in its efficiency with respect to the frequency transmission curve, i.e. the transmitted frequency distribution and the limiting of very high sound intensities, by a PC (peak clipping) adjustment.

As can be seen from FIG. 3, the switch 10 is attached on a plate 30 in adapted mounts 31 and 32. It serves to switch the device on and off and to connect the signal pickup by means of a microphone 18 or an induction coil 34 combined with the controls 26 and 27 to operate as a unit.

The amplifier 19 is assembled on a flexible foil 40 which includes on its flat surfaces copper conductor layers 42 and 43 which form printed circuits. Associated with the conductor paths of layer 43 is, toward the underside, an adhesive layer 45 which carries rigid mounting plates 46 to 49, of which those marked by 47 to 49 are covered on their side away from the adhesive layer 45 with a copper conductive path layer 50 to 52, onto which electrical components or circuits 53 designed in the form of chips are then soldered at the points 53.1.

Toward the other side, the conductor paths of layer 42 are followed by electrical components which are soldered by their lugs to foil 40 in the usual manner. They are, for instance, capacitors 54, an integrated circuit 54.2, the volume control 7 with its control knob 8.1, and the switch 10 as well as the taps 55 and 56, which for connecting a current source extend into the battery holder 6.

Figure 6:
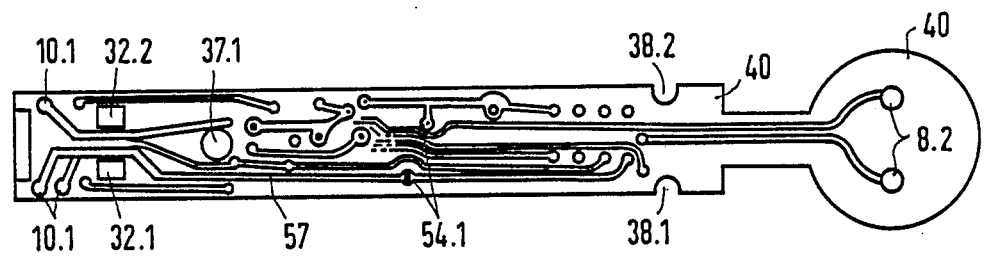
FIG. 6 is a top view illustrating the intermediate layer of the amplifier.
Figure 7:
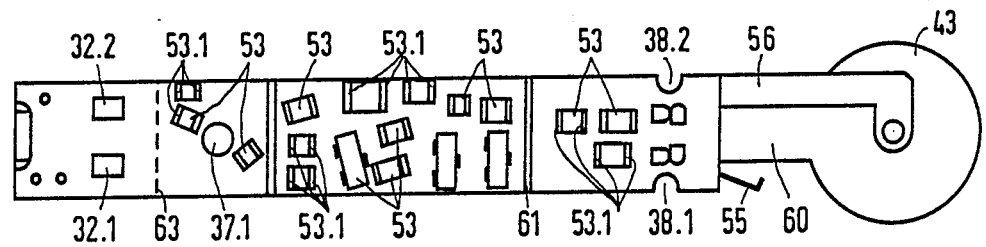
FIG. 7 illustrates the bottom view of the amplifier shown in FIG. 4.

It is apparent from FIG. 6 that the conductive coating 43 of foil 40 is divided into conductor paths 57, which comprise solder points 10.1 of switch 10 and the solder points marked 54.1 of the electrical components 54 as well as the solder points 8.2 of the volume control 7 and the taps 55 and 56.

Between the plates 46 to 49, bending zones 60 to 63 remain. In the views of layers 40 to 43 also visible are points for the attachment of the amplifier 19 in the housing 1. These are the opening 37.1 for screw 37 (FIG. 3) and lateral cutouts 38.1 and 38.2 for the screws, of which the one marked 38 is visible in phantom in FIG. 3. It covers up the second screw lying therebehind along the outer side of the housing 1. Besides, the layered construction is suspended in openings 32.1 and 32.2 at the rear mount of switch 10 formed by the pins 32 (FIG. 3).

In FIG. 3 the position of the amplifier 19 in housing 1 is indicated. In extends from switch 10 to the volume control 7. Flexing at the bending zones 60 to 63 results in the curved adaptation of amplifier 19 for convenient placement within the housing 1.

There has thus been shown and described a novel miniature hearing aid which fulfills all the objects and advantages sought therefor. Many changes, modifications, variations and other uses and applications of the subject invention will, however, become apparent to those skilled in the art after considering the specification and the accompanying drawing which disclose preferred embodiment thereof. All such changes, modifications, variations and other uses and applications which do not depart from the spirit and scope of the invention are deemed to be covered by the invention which is limited only by the claims which follow.

What is claimed is:

1. A miniature hearing aid of the type having a housing with a substantially convex profile in which at least the following electrical components are included, an input transducer, an amplifier with control elements, a current source, and an output transducer, where at least a portion of the amplifier is formed on component mounting surfaces hinged together and connections among the components are provided by a support with electrically conducting paths, characterized in that:

said amplifier includes a multi-layered arrangement of said component mounting surfaces having a substantially elongated rectangular shape and which is bendable so that after having been installed in said hearing aid housing said multi-layered arrangement can conform to said substantially convex profile;

said multi-layered arrangement comprising at least three layers, of which the two outer layers are adapted for the attachment of said electrical components thereon and lie over a flexible continuous layer intermediate said two outer layers, said continuous layer running the length of said elongated rectangular shaped multi-layered arrangement and provided with conductor paths; and said amplifier being sub-divided into structural sections of said multi-layered arrangement, each structural section comprising a group of electrical components which are attached thereto, adjacent structural sections being separated by bending zones, each bending zone having a length extending in a direction perpendicular to the length of said multi-layered arrangement and having a width which is relatively narrow so as to allow said bending zones to be bent only in a direction perpendicular to the plane of the multi-layered arrangement, and said electrical components being arranged on both sides of at least some of said structural sections.

2. A miniature hearing aid according to claim 1, further characterized in that at least one of the two outer layers of a three-layer system amplifier includes electrical components in the form of integrated circuits soldered to the electrically conducting paths.

3. A miniature hearing aid according to claim 1, further characterized in that one of the outer layers has attached thereon substantially only electronic components of the type having leads and the other one of the outer layers has attached thereon only leadless electrical components.

4. A miniature hearing aid according to claim 1, further characterized in that the intermediate layer extends beyond the structural sections and comprises at one end conductor paths connected to a switch, while at the other end conductor paths are connected up to contacts for a current source to be connected with the amplifier.

5. A miniature hearing aid according to claim 1, further characterized in that the subdivision of amplifier components into structural sections is into three groups of components, the central one of the three groups including a combination of at least two controls and an induction coil.

6. A miniature hearing aid according to claim 5, characterized in that the conductor paths of the intermediate layer form a printed circuit which interconnects the components contained in the structural groups.

7. A miniature hearing aid of the type having a housing with a substantially convex profile in which at least the following electrical components are included, an input transducer, an amplifier with control elements, a current source and an output transducer, wherein at least a portion of said amplifier is formed on component mounting surfaces hinged together and connections among said electrical components are provided by a support having electrically conducting paths, characterized in that:

said amplifier includes a multi-layered arrangement which is bendable so as to conform to said convex profile of said housing, said multi-layered arrangement comprising at least three layers, the two outer layers of which are adapted for the attachment of said electrical components thereon and lie over a single flexible layer which is intermediate said two outer layers;

said multi-layered arrangement is sub-divided into structural sections, adjacent ones of which have bending zones therebetween,; and said multi-layered arrangement is bendable at said bending zones only in a direction perpendicular to the plane of said multi-layered arrangement, with said electrical components being arranged on both sides of said multi-layered arrangement.

* * * * *